Figure 1:
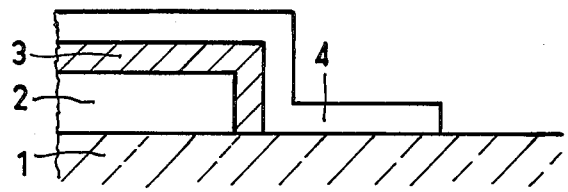

United States Patent [19]

Binet

[11] Patent Number: 4,475,120

[45] Date of Patent: Oct. 2, 1984

[54] METHOD OF RAISING THE BREAKDOWN VOLTAGE OF AN INTEGRATED CAPACITOR AND CAPACITOR MANUFACTURED BY THIS METHOD

[75] Inventor: Michel J. M. Binet, Creteil, France

[73] Assignee: U.S. Philips Corporation, New York, N.Y.

[21] Appl. No.: 391,266

[22] Filed: Jun. 24, 1982

[30] Foreign Application Priority Data

Jul. 8, 1981 [FR] France .................................. 81 13424

[51] Int. Cl.³ .................... H01L 29/00; H01L 21/441; H01L 21/465
[52] U.S. Cl. ........................................ 357/51; 357/55; 427/79; 427/96; 204/38 A; 156/657; 361/275; 361/304
[58] Field of Search ............................ 427/79, 80, 96; 29/25.42; 361/275, 304; 204/38 A; 156/657, 662; 357/51, 55

[56] References Cited

U.S. PATENT DOCUMENTS

| | | | |
|---|---|---|---|
| 3,466,719 | 9/1969 | Sharif et al. | 29/25.42 |
| 3,619,387 | 11/1971 | Mindt et al. | 427/80 X |
| 3,679,942 | 7/1972 | Daly | 29/25.42 X |
| 3,714,529 | 1/1973 | Cowpland et al. | 361/304 |

Primary Examiner—John D. Smith
Assistant Examiner—Bernard F. Plantz
Attorney, Agent, or Firm—Paul R. Miller

[57] ABSTRACT

The invention relates to a method suitable for raising the breakdown voltage of a capacitor of the integrated circuit type formed on a semiconductor substrate and characterized in that the lower plate of the capacitor is under etched so that an air wedge is obtained. As a result of the air wedge, the electric current passed through the semiconductor material is lengthened and the breakdown phenomena at the edges of the capacitor are reduced. The invention also relates to capacitors obtained in this manner.

11 Claims, 5 Drawing Figures

METHOD OF RAISING THE BREAKDOWN VOLTAGE OF AN INTEGRATED CAPACITOR AND CAPACITOR MANUFACTURED BY THIS METHOD

The invention relates to a method of forming an integrated capacitor with increased breakdown voltage on a semiconductor substrate comprising a first metal layer deposited on at least a part of the semiconductor substrate, a second dielectric layer deposited on the said first metal layer or formed from this layer and a third metal layer covering the said second dielectric layer and extending on at least another part of the semiconductor substrate. It also relates to integrated capacitors manufactured by this method and to integrated circuits comprising at least one such capacitor.

The integrated capacitors are well known from the prior art and are constructed in particular in the form of a stack of thin layers of the conducting-dielectric-conducting type.

With a view to the manufacture of capacitors of high capacitance it is necessary to deposit a very thin dielectric layer (thickness less than 1000 Å) between two metal layers constituting the plates of the capacitor and then a large number of problems arise, in particular the difficulty of controlling the thickness of the dielectric layer and the drop of the breakdown voltage, which phenomenon particularly occurs in the vicinity of the edges.

The invention has for its object to mitigate the aforementioned disadvantages by providing a novel method of manufacturing these capacitors.

The method in accordance with the invention is characterized in that a first metal layer is deposited on at least a part of a semiconductor substrate, in that a part of the semiconductor substrate is removed along the periphery of and under the first metal layer, in that then the second dielectric layer is deposited or formed so that it wholly covers the free surface of the first metal layer, and in that finally the third metal layer is deposited so that it covers the second dielectric layer and extends on at least another part of the semiconductor substrate, while an empty space is left along the periphery of and under the first metal layer.

In this manner, the two metal layers are removed in the vicinity of the edge over a distance which is sufficient to strongly reduce the breakdown phenomena.

The semiconductor material may be silicon, a III–V compound and in one specific embodiment this material is gallium arsenide, which compound is frequently utilized in the manufacture of superfrequency components due to its very favourable intrinsic properties.

According to an embodiment of the invention, the first metal layer consists of aluminium, while the second dielectric layer consists of alumina obtained by superficial anodization of this first metal layer.

The following description with reference to the accompanying drawings given by way of non-limiting example permits of better understanding the invention and determining its scope.

FIG. 1 is a sectional view of an integrated capacitor according to the prior art, FIGS. 2 to 5 inclusive are sectional views of the various stages of the method according to the present invention.

According to the prior art, an integrated capacitor of the kind, shown in FIG. 1, comprises on a semiconductor substrate 1 a first metal layer 2 of, for example, tantalum, or aluminium, a second dielectric layer 3 of, for example, silica $SiO_2$ obtained by chemical vapour deposition (CVD) or of silicon nitride $Si_3N_4$ obtained by plasma-deposition at a low temperature, and finally a third metal layer 4 which extends on this preceding layer and adjoins the semiconductor substrate 1 so that a zone is obtained which is sufficient for contacting.

When the dielectric layer 3 is very thin and has, for example, a thickness less than 1000 Å, breakdown phenomena for voltages of the order of a few volts frequently occur at the periphery of the first metal layer across the semiconductor substrate, which phenomena are due to the small distance between the two metal plates.

A solution for this problem consists in that the second dielectric layer 3 extends in a manner such that it also adjoins the semiconductor substrate 1. However, this solution is not always attainable, in particular when the second dielectric layer 3 is not a deposited layer, but a layer formed from the first layer, for example, by superficial oxidation.

Figure 2:
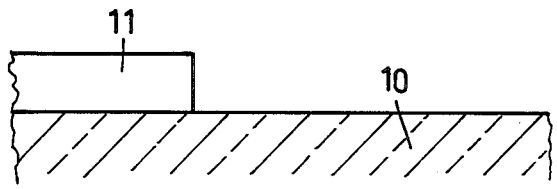

The method of manufacturing integrated capacitors according to the present invention consists in carrying out the following successive stages shown in FIGS. 2 to 5 inclusive:

In a first stage as shown in FIG. 2, a first metal layer 11 of, for example, aluminium (or tantalum), is deposited on a semiconductor substrate 10 by means of a conventional method, such as evaporation in vacuo through a mask, or by serigraphic application of an aluminium paste or any other suitable method.

Figure 3:
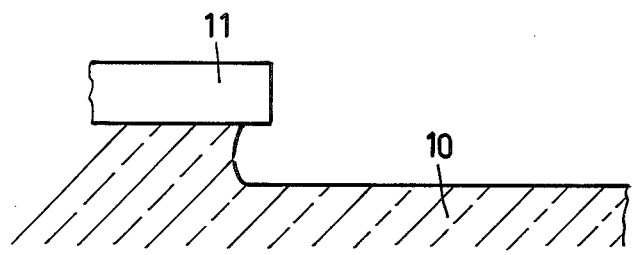

In a second stage as shown in FIG. 3, in which the same elements are designated by the same reference symbols, a part of the semiconductor substrate 10 is removed, for example, by means of a chemical etching bath, which etching treatment is continued under the first metal layer so that an under-etching is obtained over a distance of the order of microns. In the case of a semiconductor material such as GaAs, a chemical etching bath of, for example, citric acid which is diluted (and to which hydrogen peroxide is added) is particularly suitable; an under-etching of 1 $\mu m$ is obtained in ten minutes and this etching treatment is stopped by soaking the substrate several times in deionized water.

Figure 4:
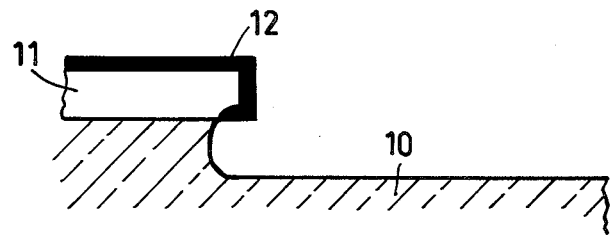

In a third stage as shown in FIG. 4, a second dielectric layer 12 is deposited on or formed from the first metal layer 11 so that it wholly covers the free surface of the first metal layer 11.

Preferably, this complete covering is obtained by superficial anodization of the first metal layer 11. Thus, in the case of a first layer of aluminium, this layer is superficially converted into alumina by anodization upon humidification by means of a known method which consists in that the layer to be covered is immersed in an electrolyte (water+tartaric acid, for example) and in that a current is caused to flow between a platinum electrode acting as a cathode and the aluminium layer acting as an anode. In a few minutes, depending upon the density of the current, a layer of alumina of a few hundred Å can be obtained, while by the application of a potential difference for a few tens of minutes the density of this layer can be increased so that it is rendered more suitable for the intended use.

Figure 5:
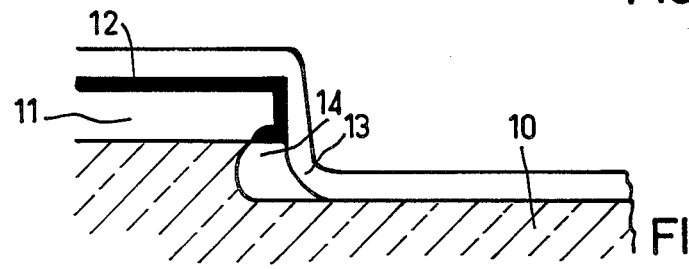

In a fourth and last stage as shown in FIG. 5, a third metal layer 13 is deposited so that it covers the second dielectric layer 12 and extends on another part of the semiconductor substrate in a manner such that a contact zone is obtained or that a connection between other elements formed on the semiconductor substrate or connected to it is established.

This third metal layer 13 may be made of any arbitrary electrically conducting material, such as titanium, gold etc.

The deposition of this layer may be effected by any method, such as evaporation in vacuo, serigraphy, reactive pulverization etc., which method must be suitable to ensure the formation of a permanent non-covered air wedge 14; such an air wedge 14 permits obtaining a suitable distance between the two metal layers 12 and 13 constituting the plates of the capacitor so that the electric current path through the semiconductor substrate is sufficiently long to ensure that the breakdown voltage increases to suitable values of more than 10 V, taking into account the obtained capacitances of the order of 2000 pF/mm$^2$.

Moreover, the superfrequency measurements carried out on the capacitor thus manufactured have shown the occurrence of a very small variation of the capacitance with frequency up to values as high as 12 GHz, while the losses were far below 0.1 dB.

It will be clear to those skilled in the art that a large number of variations are imaginable which are obvious and so do not depart from the scope of the invention defined by the appended claims.

What is claimed is:

1. A method of forming an integrated capacitor with increased breakdown voltage on a semiconductor substrate comprising a first metal layer deposited on at least a part of the semiconductor substrate, a second dielectric layer deposited on the said first metal layer or formed from this layer and a third metal layer covering the said second dielectric layer and extending on at least another part of the semiconductor substrate, characterized in that said first metal layer is deposited on at least a part of said semiconductor substrate, in that a part of the semiconductor substrate is removed along the periphery of and under said first metal layer, in that said second dielectric layer is then deposited or formed so that it wholly covers the free surface of the said first metal layer, and in that finally said third metal layer is deposited so that it covers said second dielectric layer and extends on at least another part of the semiconductor substrate, while an emtpy space is left along the periphery of and under said first metal layer.

2. A method as claimed in claim 1, characterized in that said semiconductor substrate is made of gallium arsenide.

3. A method as claimed in claim 2, characterized in that said first metal layer is made of aluminium.

4. A method as claimed in claim 3, characterized in that said second dielectric layer is made of alumina obtained by superficial anodization of said first metal layer of aluminium.

5. A method as claimed in claim 2, characterized in that a part of said semiconductor substrate is removed along the periphery of and under said first metal layer by means of a chemical etching bath.

6. A method as claimed in claim 5 characterized in that said chemical etching bath comprises citric acid.

7. An integrated capacitor on a semiconductor substrate of the type comprising a first metal layer deposited on at least a part of said semiconductor substrate, a second dielectric layer deposited on or formed from said first metal layer, and a third metal layer covering said second dielectric layer and extending on at least another part of the semiconductor substrate, characterized in that said first metal layer is deposited on at least a part of said semiconductor substrate, in that a part of the semiconductor substrate is removed along the periphery of and under said first metal layer, in that said second dielectric layer is then deposited or formed so that it entirely covers the free surface of said first metal layer, and in that said third metal layer is deposited so that it covers said dielectric layer and extends on at least another part of the semiconductor substrate, while an empty space is left along the periphery of and under said first metal layer.

8. An integrated circuit comprising at least a capacitor as claimed in claim 7.

9. A method as claimed in claim 1, characterized in that said first metal layer is made of aluminum.

10. A method as claimed in claim 9, characterized in that said second dielectric layer is made of alumina obtained by superficial anodization of said first metal layer of aluminum.

11. A method as claimed in claim 1, characterized in that a part of said semiconductor substrate is removed along the periphery of and under said first metal layer by means of a chemical etching bath.

* * * * *